US006515516B2

(12) United States Patent
Morgan

(10) Patent No.: US 6,515,516 B2
(45) Date of Patent: Feb. 4, 2003

(54) SYSTEM AND METHOD FOR IMPROVING SIGNAL PROPAGATION

(75) Inventor: Donald M. Morgan, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/766,756

(22) Filed: Jan. 22, 2001

(65) Prior Publication Data

US 2002/0097068 A1 Jul. 25, 2002

(51) Int. Cl.[7] .................................. H03K 19/175
(52) U.S. Cl. .................... 326/86; 326/30; 326/56; 326/58; 326/81; 326/83
(58) Field of Search ............................ 326/30, 56–58, 326/80, 81, 83, 86

(56) References Cited

U.S. PATENT DOCUMENTS

| | | | | |
|---|---|---|---|---|
| 6,014,036 A | * | 1/2000 | Bozso et al. | 326/21 |
| 6,218,862 B1 | * | 4/2001 | Meyer | 326/86 |
| 6,307,397 B1 | * | 10/2001 | Mueller et al. | 326/81 |
| 6,313,663 B1 | * | 11/2001 | Mueller et al. | 326/83 |
| 6,359,471 B1 | * | 3/2002 | Mueller et al. | 326/81 |

* cited by examiner

*Primary Examiner*—Michael Tokar
*Assistant Examiner*—Vibol Tan
(74) *Attorney, Agent, or Firm*—Schwegman, Lundberg, Woessner & Kluth, P.A.

(57) ABSTRACT

Systems and methods are provided for improving signal propagation. A repeater segments a transmission line into a first and a second line. The repeater includes an inverting amplifier and an equilibration circuit. The inverting amplifier has an input connected to the first line and an output connected to the second line. The amplifier receives and an input signal at a first logic potential and transmits an output signal at an inverted second logic potential during and an active portion of a cycle. The equilibration circuit electrically isolates the first line and the second line and shorts the first line to the second line during and an inactive portion of the cycle. Upon completion of the inactive portion of the cycle, the first line and the second line have substantially equal starting potentials between the first logic potential and the second logic potential. Setting the starting potential between the first and second logic potentials shortens the delay associated with a transition between logic potentials. Additionally, one embodiment of the equilibration circuit selectively disconnects the amplifier from the power rails.

75 Claims, 8 Drawing Sheets

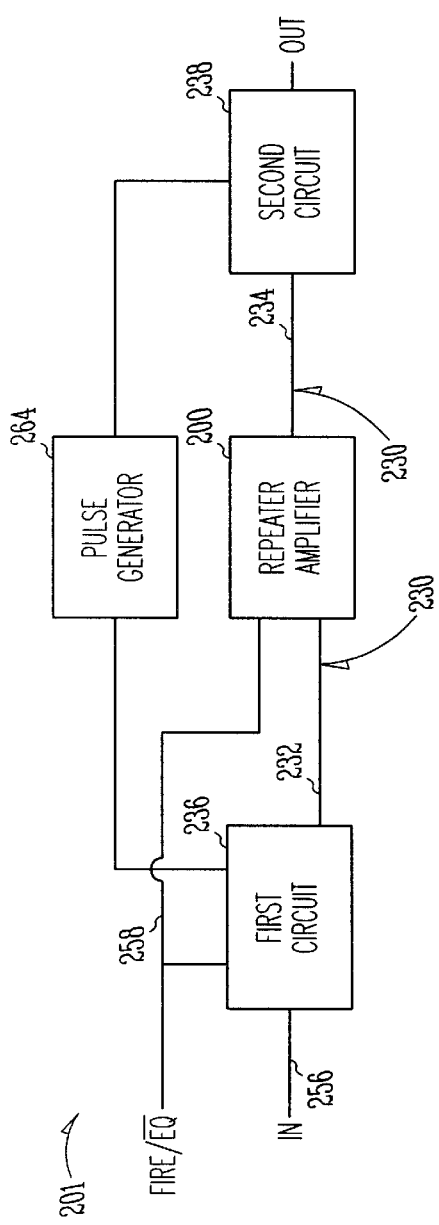
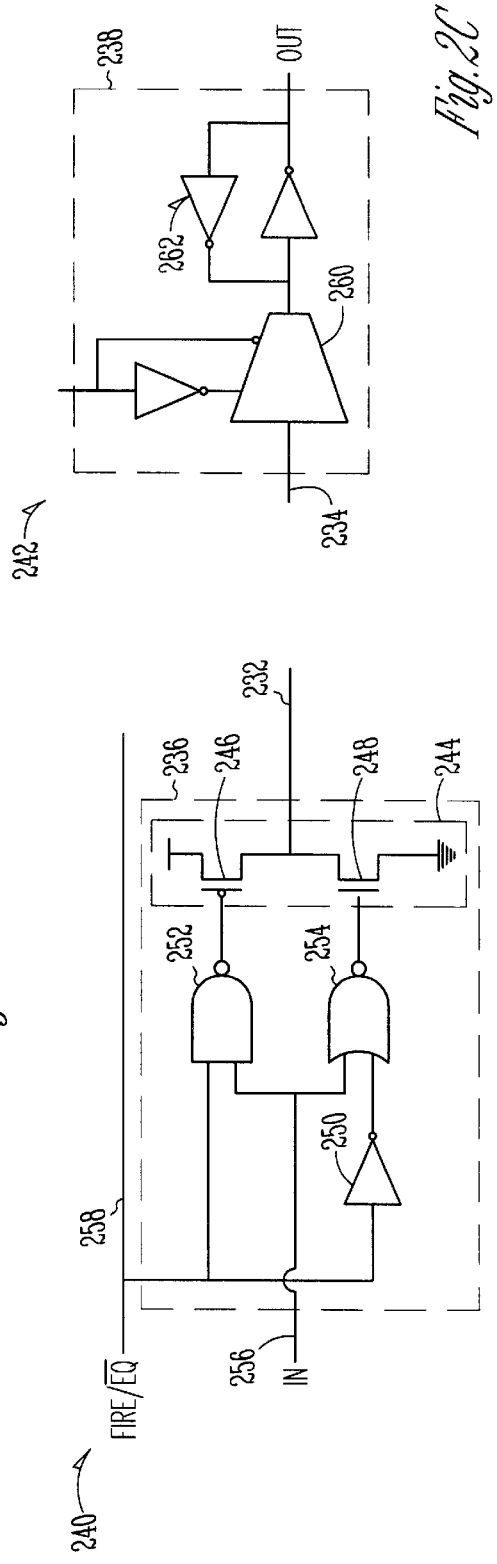
Fig.2A
Fig.2B
Fig.2C

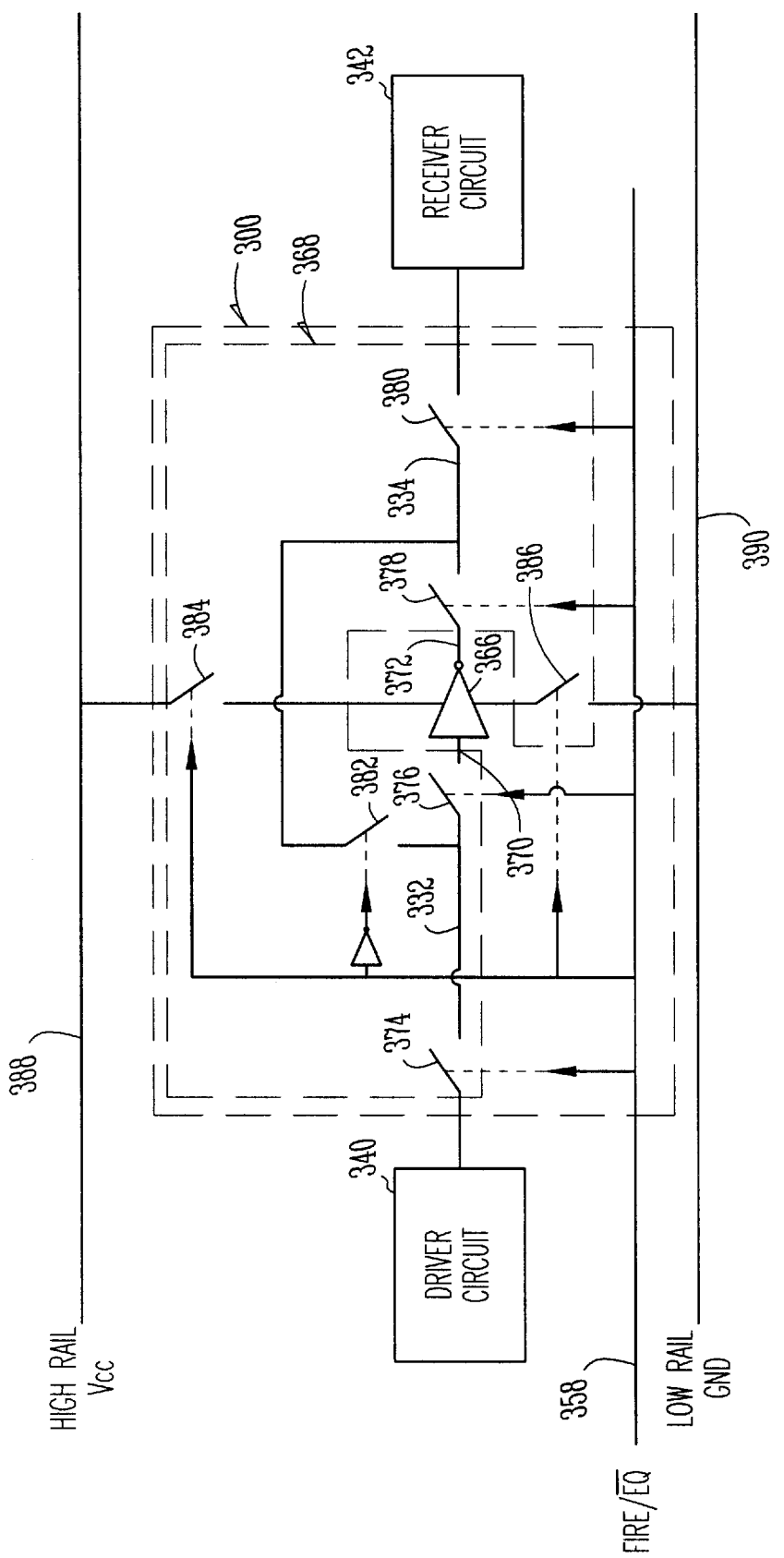

US 6,515,516 B2

SYSTEM AND METHOD FOR IMPROVING SIGNAL PROPAGATION

TECHNICAL FIELD OF THE INVENTION

This invention relates generally to integrated circuits and in particular to systems and methods for improving signal propagation on integrated circuit transmission lines.

BACKGROUND OF THE INVENTION

The semiconductor industry is moving to smaller feature sizes and larger die sizes. As such, integrated circuits incorporate relatively long transmission lines. Transmitting signals over relatively long integrated circuit transmission lines may cause an unacceptable delay that is attributable to the capacitance associated with the transmission lines. Repeaters, also referred to as repeater amplifiers or buffer drivers, have been placed in line along the transmission line in an attempt to alleviate this delay problem. The repeater boosts the signal edge rate enough to compensate for a logic delay introduced by the repeater. One example of a repeater is an inverting amplifier or buffer. Signal propagation problems associated with the inverting amplifier include those that relate to propagation speed and power consumption.

The inverting amplifier encounters a delay during transitions between logic potentials. The dotted line in FIG. 1 shows by way of example a simulation of an inverting amplifier in which the output is at an initially low logic potential, and then is driven to a high logic potential to make a full or complete low-to-high logic transition. The delay associated with making a complete low-to-high logic transition, in on example of the inverting amplifier, is about 400 picoseconds. As viewed by the inverting amplifier, the input signal is considered to be random as it can require the output to be driven high or low without advance notice. Thus, the amplifier should be able to quickly drive the output to either a high or low potential. However, although no delay is incurred when the output remains at its previous logic potential, the propagation speed for a transmission line system is limited by the worse case delay that occurs when the input signal requires a complete high-to low or low-to-high logic transition.

Not only does the complete voltage potential transition create a delay, but it also requires a power supply to provide the current to raise the voltage from a low logic potential to a high logic potential on one of the two sides of the inverting amplifier. When the voltage potential transitions from the high logic potential back to the low logic potential, the charge is effectively dumped to the bus by shorting the high side of the inverting amplifier to ground. The power supply again provides the required current for the voltage potential to transition from the low logic potential back to a high logic potential. FIG. 12 illustrates an extreme example wherein a conventional full-logic transition wave form switches between low and high logic potentials every cycle. The repetitive charging and dumping for each complete voltage potential transition has a relatively high instantaneous power consumption demand.

Therefore, there is a need in the art to provide a system and method for improving signal propagation on integrated circuit transmission lines which overcomes these problems.

SUMMARY OF THE INVENTION

The above mentioned problems are addressed by the present subject matter and will be understood by reading and studying the following specification. The present subject matter improves signal propagation, particularly on an integrated circuit transmission line. A repeater divides or segments a transmission line or wire track into a first line and a second line. The repeater receives an active segment, i.e. a signal that makes transitions between high and low logic potentials, signal on the first line and transmits an inverted signal on the second line such that one of these lines is at a high logic potential and the other line is at a low logic potential. The signal has cycles that are comprised of an inactive portion and an active portion. In one embodiment, a control signal defines the duration of the active portion and inactive portion of the cycles. The signal makes the transition to either the high or low logic potential during the active portion. Charge is shared between the two lines during the inactive portion of the cycle such that, upon completion of the inactive portion, both the first line and the second line are at starting potentials which are substantially the same and which are between the low logic potential and the high logic potential. The starting potential is the potential that is on the line at the beginning of the active portion of the cycle; i.e. at the beginning of the signal transition to either the high or low logic potential. Rather than by beginning the logic transition from either the low logic potential or the high logic potential and then making a full transition to the other logic potential, the worse-case logic transition delay for the transmission line is shortened by beginning the logic transition from this starting potential and then making a transition to either the low logic potential or high logic potential.

One aspect provides an integrated circuit transmission line repeater. The repeater generally comprises an inverting amplifier and an equilibration circuit. The inverting amplifier has an input connected to a first line and an output connected to a second line. The amplifier receives an input signal on the first line at a first logic potential and transmits an output signal on the second line at a second logic potential during an active portion of a cycle. The equilibration circuit electrically isolates the first line and the second line and shorts the first line to the second line during an inactive portion of the cycle such that upon completion of the inactive portion, the first line and the second line will be at substantially the same starting potential between the low logic potential and the high logic potential.

Another aspect provides a method for signaling over a transmission line that generally comprises a first process that is performed during an active portion of a cycle, and a second process that is performed during an inactive portion of the cycle. The first process includes receiving an input signal on a first line at a first logic potential, and transmitting an inverted output signal on a second line at a second logic potential. The second process includes isolating both the first line and the second line, and electrically shorting the first line to the second line to provide substantially equal potentials between the first logic potential and the second logic potential.

These and other aspects, embodiments, advantages, and features will become apparent from the following description of the invention and the referenced drawings.

BRIEF DESCRIPTION OF THE DRAWINGS

FIG. 2A illustrates a transmission line system according to the present subject matter.

FIG. 2B illustrates a driver circuit as the first circuit found in the system of FIG. 2a.

FIG. 2C illustrates a receiver circuit as the second circuit found in the system of FIG. 2A.

FIG. 3 illustrates a repeater according to the present subject matter.

DETAILED DESCRIPTION OF THE INVENTION

Figure 1:
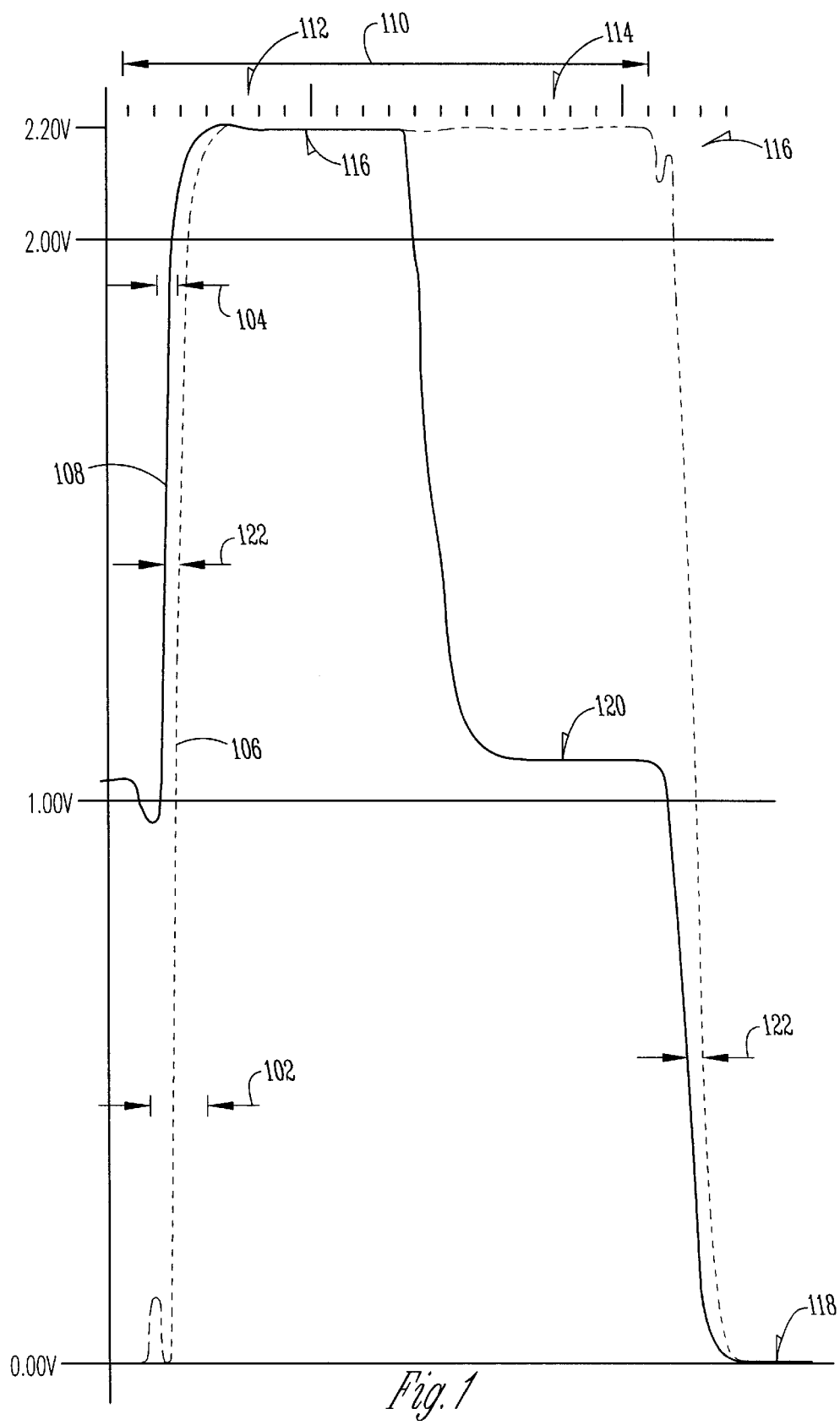
FIG. 1 is a timing diagram that provides potential transitions for comparison, including: a starting potential to high logic potential transition; a starting potential to low logic potential transition; and a conventional full low-to-high and high-to-low logic potential transition.

The following detailed description of the invention refers to the accompanying drawings which show, by way of illustration, specific aspects and embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

The present subject matter improves signal propagation, particularly on an integrated circuit transmission line. A repeater divides or segments a transmission line or wire track into a first line and a second line. The repeater receives an active segment, i.e. a signal that makes transitions between high and low logic potentials, signal on the first line and transmits an inverted signal on the second line such that one of these lines is at a high logic potential and the other line is at a low logic potential. The signal has cycles that are comprised of an inactive portion and an active portion. In one embodiment, a control signal defines the duration of the active portion and inactive portion of the cycles. The signal makes the transition to either the high or low logic potential during the active portion. Charge is shared between the two lines during the inactive portion of the cycle such that, upon completion of the inactive portion, both the first line and the second line are at starting potentials which are substantially the same and which are between the low logic potential and the high logic potential. The starting potential is the potential that is on the line at the beginning of the active portion of the cycle; i.e. at the beginning of the signal transition to either the high or low logic potential. Rather than by beginning the logic transition from either the low logic potential or the high logic potential and then making a full transition to the other logic potential, the worse-case logic transition delay for the transmission line is shortened by beginning the logic transition from this starting potential and then making a transition to either the low logic potential or high logic potential.

FIG. 1 illustrates a logic transition delay 102 for an inverting amplifier during a full low-to-high logic potential transition, and also illustrates the delay 104 encountered by the repeater according to the present subject matter. As this illustration is provided as an example of a logic transition delay characteristic of one inverting amplifier, the specific values contained in FIG. 1 should not be considered limiting. The full logic potential transition signal 106 of a conventional inverting amplifier is illustrated by a dotted line 106. In this example, the conventional inverting amplifier encounters about a 400 picosecond delay 102 in making a complete low-to-high logic potential transition. Although no delay in the signal occurs if there is no logic transition, the full logic potential transition provides a worse case delay that limits the speed of the repeater. The logic circuitry cannot be skewed to favor one direction over the other in an attempt to improve the speed because the input signal can require the output to be driven high or low without advance notice, and as such cannot be anticipated. Thus, the propagation delay for a transmission line system is limited by the delay attributed to a complete high-to-low or low-to-high logic potential transition.

FIG. 1 also illustrates the logic transition signal 108 over a cycle 110 or signaling cycle for the repeater according to the present subject matter. The cycle 110 includes an active portion 112 and an inactive portion 114. Logic transitions to either the high-logic potential 116 or low-logic potential 118 are performed during the active portion 112, and a starting potential 120 is established during the inactive portion 114. The starting potential 120 is between the low-logic potential 118 and the high-logic potential 116. In the example illustrated in FIG. 1, the starting potential 120 is between about 1.00 volts and about 1.10 volts, the high-logic potential 116 is about 2.20 volts and the low-logic potential 118 is about 0.00 volts. By providing a starting potential 120 that is about halfway between the low-logic potential 118 and the high-logic potential 116, the initial potential at the input of the repeater, which is described in more detail below, begins the active portion 112 of the cycle 110 approximately half-way to making a logic transition to either the low logic potential 118 or the high-logic potential 116. In the example illustrated in FIG. 1, the repeater only requires about 200 picoseconds to make the logic transition from the starting potential 120 into either the high-logic potential 116 or the low-logic potential 118. Thus, as illustrated at 122, the delay associated with the worse case scenario is reduced, and the effective speed of the transmission line is improved.

FIG. 2A illustrates one aspect that provides an integrated circuit transmission line repeater 200. The repeater 200 or repeater amplifier segments a transmission line 230 into a first or input line 232, and a second or output line 234. A first circuit 236 is connected to the first line 232, and a second circuit 238 is connected to the second line 234. In other words, the transmission line 230 is divided by at least one repeater 200 into at least a first line 232 connected to the first circuit 236 and at least a second line 234 connected to the second circuit 238. The transmission line 230 is segmented into additional lines if additional repeaters are used to boost the signal in the transmission line 230. One embodiment of the first circuit 236 is or includes a driver circuit 240 for transmitting a data signal onto the transmission line to the repeater 200, and one embodiment of the second circuit 238 is or includes a receiver circuit 242 for receiving a boosted data signal from the repeater 200. The driver circuit 240 and receiver circuit 242 are formed either as discrete components, or as part of other circuitry within the integrated circuit design.

FIG. 2B shows an example of the driver circuit 240 and FIG. 2C shows an example of the receiver circuit 242. The driver circuit 240 comprises a driving inverter 244 that includes a PMOS transistor 246 and an NMOS transistor 248 in a stacked configuration. The gates of the driving transistors 246 and 248 are controlled by logic gates, specifically an inverter 250, a NAND 252 and a NOR 254. An input data line 256 and a FIRE/ /EQ control line 258 provide the input signals to the logic gates. The FIRE/ /EQ control line 258 controls or determines the active portion 112 and inactive portion 114 of the cycle 110, as discussed above with respect to FIG. 1. Based on the label used, a high FIRE/ /EQ control line 258 fires or drives the data signal, and as will be discussed in more detail below, and low FIRE/ /EQ control line 258 isolates the first line 232 and the second line 234, and shorts the first line 232 to the second line 234 to equilibrate the potentials on each of these lines.

FIG. 2C shows that the illustrated receiver circuit 242 includes a transmission gate 260 that allows the data signal to pass through during the active portion 112 of the cycle 110, and a latch 262 for retaining the desired output logic potential during the inactive portion 114 of the cycle 110. A pulse generator 264 provides a pulse in response to an edge in the FIRE/ /EQ control signal 258. The pulse is appropriately timed to catch good output data by selectively allowing an output signal from the repeater amplifier 200 to pass through the transmission gate 260 and be retained in the latch 262. Also, as the direction of the FIRE/ /EQ control signal 258 may be anticipated, the pulse generator may include circuitry that is skewed to favor one direction over the other in an attempt to improve the speed of the pulse and beat the input signal to the transmission gate 260.

FIG. 3 again shows the repeater 300 positioned along a transmission line in between the driver circuit 340 and the receiver circuit 342 to segment the transmission line into the first line 332 and the second line 334. FIG. 3 illustrates the function of the repeater 300 using logic switches. The repeater 300 generally comprises an inverting amplifier 366 and an equilibration circuit 368, the function of which is illustrated by the logic switches. The equilibration circuit 368 is generally controlled by the FIRE/ /EQ control signal 358 that also defines the active portion 112 and the inactive portion 114 of the cycles 110. The inverting amplifier 366 has an input 370 connected to the first line 332 and an output 372 connected to the second line 334. During the active portion 112 of the cycle 110, the inverting amplifier 366 receives an input signal on the first line 332 at a first logic potential and transmits an inverted output signal on the second line 334 at a second logic potential. During the inactive portion 114 of the cycle 110, the equilibration circuit 368 electrically isolates the first line 332 and the second line 334, and shorts the first line 332 to the second line 334. The first line 332 is isolated from the first circuit 340 and from the inverter amplifier 366. The second line 334 is isolated from the second circuit 342 and from the inverter amplifier 366. Because the amplifier 366 within the repeater 300 is an inverting amplifier, one of the two lines will be at a high-logic potential and the other will be at a low-logic potential upon completion of the active portion 112 of the cycle 110. By shorting the first line 332 to the second line 334, the first line 332 and the second line 334 will be at substantially the same starting potential 120 between the low-logic potential 118 and the high-logic potential 116 upon completion of the inactive portion 114 of the cycle 110.

In one embodiment, the repeater 300, or the inverter amplifier contained therein, segments the transmission line to form the first line 332 and the second line 334 in such a manner that the first line 332 and the second line 334 have substantially equal capacitance, i.e. the lines are able to hold substantially the same charge. In this embodiment, upon completion of the-active portion 112 of the cycle 110, the first line 332 has a first logic potential and the second line 334 has a second logic potential; and upon completion of the inactive portion 114, both the first line 332 and the second line 334 will be at a starting potential 120 that is approximately midway between the low-logic potential 118 and the high-logic potential 116. That is, the potential at the input and output of the inverting amplifier 366 begins to make a logic transition at the start of the active portion of the cycle in between the high logic potential 116 and the low logic potential 118.

The switched logic illustration of the equilibration circuit 368 of FIG. 3 shows that a high FIRE/ /EQ control signal 358 closes the input logic switches 374 and 376 on the first line 332 and the output logic switches 378 and 380 on the second line 334 to provide a transmission path through which the data signal is transmitted from the driver circuit 340 to the inverting amplifier 366, and to the receiver circuit 342. Additionally, a high FIRE/ /EQ control signal 358 opens an equilibration logic switch 382. However, a low FIRE/ /EQ control signal 358 opens the input logic switches 374 and 376 and the output logic switches 378 and 380 to isolate the first line 332 and the second line 334, and also closes the equilibration logic switch 382 to provide a short between the isolated first line 332 and the isolated second line 334. The charge on these lines are distributed equally between these two lines.

In one embodiment, the equilibration circuit 368 also includes power cutoff logic switches 384 and 386. A high FIRE/ /EQ control signal 358 closes the power cutoff logic switches 384 and 386 and allows the inverting amplifier 366 to produce an inverted data signal. However, a low FIRE/ /EQ control signal 358 opens the power cutoff logic switches 384 and 386 to isolate the inverting amplifier 366 from the power supply, which is illustrated as a high rail 388 and a low rail 390 in FIG. 3. Isolating the repeater 300 from the power supply during inactive portions 114 of the cycle 110 decreases the amount of power that is consumed by the repeater 300.

It is seen that isolating the first line 332 from the second line 334 includes isolating the first line 332 from the driver circuit 340 and the second line 334 from the receiver circuit 342. The equilibration circuit 368, including the FIRE/ /EQ control signal 358, isolates the first line 332 from the driver circuit 340, the second line 334 from the receiver circuit 342, and the inverting amplifier 366 from power rails 388 and 390 during the inactive portion 114 of the cycle 110.

Figure 9:
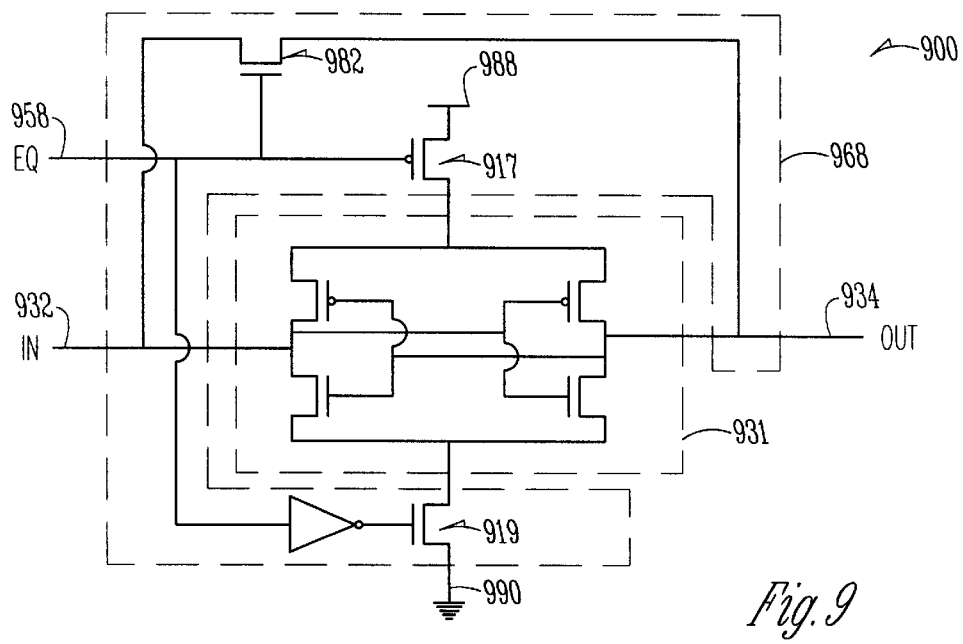
FIG. 9 illustrates another embodiment of the repeater.
Figure 10:
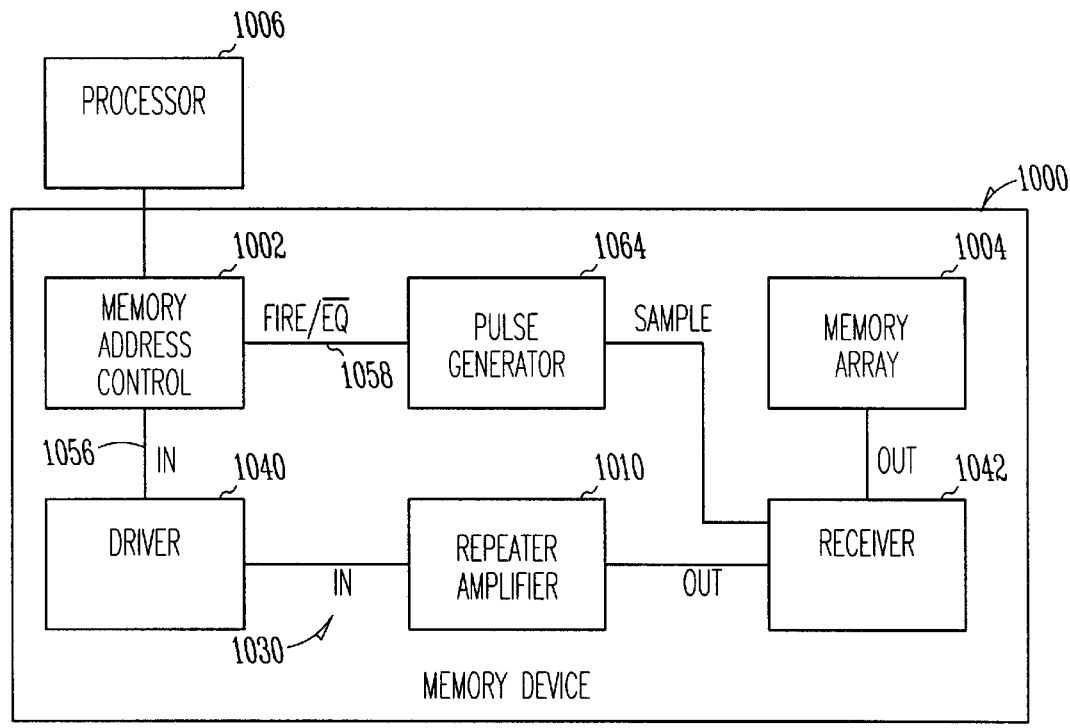
FIG. 10 illustrates a memory device system incorporating the repeater according to the present subject matter.

The control signal line shown in FIGS. 2, 3 and 10 is labeled as FIRE/ /EQ control signal such that an active-high Fire signal passes an input signal to the repeater amplifier, inverts the signal, and passes the signal as an output signal. The active-low /EQ signal isolates the first line and the second line, and shorts the first line to the second line. Thus, Fire and /EQ signals are complementary signals, wherein the Fire signal corresponds to the active portion of the cycle and the /EQ signal corresponds to the inactive portion of the cycle. The control signal line of FIGS. 4 through 9 are labeled an active high EQ signal, wherein the active-high EQ signal isolates the first line and the second line, and shorts the first line to the second line.

FIG. 2b illustrates a drive circuit 240, FIG. 2b illustrates a receiver circuit 242, and FIGS. 4–9 illustrate repeater embodiments 300, all of which are implemented in CMOS technology. It is noted that, in comparing the logic switches of FIG. 3 that illustrate the functions of the inverting amplifier and the equilibration circuit with the CMOS embodiments described below, the functional open and closed circuits shown in FIG. 3 are provided by CMOS circuitry. As such, some of the functions of the inverting amplifier 366 and the equilibration circuit 368 may be shared by the same CMOS circuit elements. For example, the isolation and shorting function of the equilibration circuit may be achieved by a capacitive effect of a gate for an unactuated transistor, the high-impedance output of CMOS logic, and the actuation of pass gate transistor, for example.

FIGS. 2 and 3 illustrate another aspect, specifically a transmission line system. The transmission line system 201 generally comprises a first circuit 236, a second circuit 238, a transmission line 230 extending between the first circuit 236 and the second circuit 238, and a repeater 200. The repeater 200 generally includes an inverting amplifier 366 and an equilibration circuit 368. The inverting amplifier 366 segments the transmission line into a first line 332 and a second line 334. The first circuit sends an input signal to the inverting amplifier and the amplifier sends an inverted output signal to the second circuit during an active portion of a cycle. The equilibration circuit 368 electrically isolates both the first line 332 and the second line 334, and shorts the first line 332 to the second line 334 during the inactive portion 114 of the cycle 110. Embodiments of the repeater were provided above, and will not be repeated here with respect to the transmission line system 201. Additionally, embodiments of the first circuit 236 and the second circuit 238 have been described above with respect to the repeater 200, and as such will not be repeated here with respect to the transmission line system 201.

One embodiment of the transmission line system 201 positions the inverting amplifier 366 substantially near a transmission line midpoint between the first circuit 236 and the second circuit 238. Another embodiment positions the inverting amplifier 366 so that the isolated first line 332 and the isolated second line 334 have substantially equal capacitance. Assuming that the transmission line has substantially uniform physical characteristics and is not adversely affected by other circuits, placing the inverting amplifier substantially near a transmission line midpoint provides the first line 332 and the second line 334 with substantially equal capacitances. Upon completion of the active portion 112 of the cycle 110, the first line 332 has a first potential corresponding to a first logic value and the second line 334 has an inverted second potential corresponding to a second logic value. Upon completion of the inactive portion 114 of the cycle 110, the first line 332 and the second line 334 have substantially equal potentials of a value between the first potential and the second potential. The FIRE/ /EQ control signal 258, generated by process control circuitry, determines or defines the cycle 110 by controlling the active portion 112 and the inactive portion 114 of the cycle 110.

The equilibration circuit 368 isolates the first line 332 from the first circuit 340 and the second line 334 from the second circuit 342. In one embodiment, the equilibration circuit 368 also isolates the inverting amplifier 366 from power rails 388 and 390 during the inactive portion 114 of the cycle 110. In a typical CMOS environment, the various isolations may occur by the following example. FIG. 2 shows that the first line 232 is effectively isolated from the driver 236 by providing a disabling control signal at the gates of the driving transistors 246 and 248. As the driving transistors 246 and 248 are off, the output of the driving invertor will be at a tri-state, high-impedance value that effectively disconnects the driver circuit 240 from the first line 232. FIG. 3 shows that the first line 232 is connected to a gate of a CMOS transistor that forms the inverter amplifier 366, which has a capacitive effect that isolates the first line 332 from the amplifier 366. The second line 334 is effectively isolated from the amplifier 366 because the transistors that form the driving inverter are disabled so that the output of the amplifier will be at a tri-state, high-impedance value that effectively disconnects the second line 334 from the amplifier 366. The second line 234 is isolated from the receiving circuit by disabling the transmission gate 260. Disabling the transistors that form the driving inverter in the amplifier 366 also serve to isolate the amplifier 366 from the power rails 388 and 390.

Figure 4:
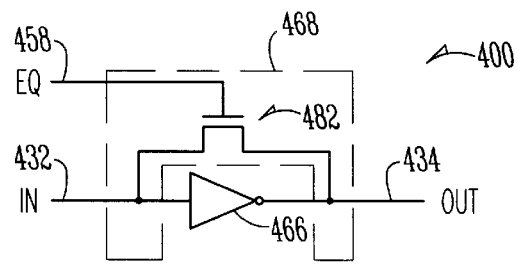
FIG. 4 illustrates one embodiment of the repeater.

FIG. 4 shows a repeater embodiment 400 wherein the inverting amplifier includes a buffer inverter 466, and the equilibration circuit 468 includes a pass gate transistor 482 that is adapted for shorting the first line 432 to the second line 434 during the inactive portion 114 of the cycle 110. The source and drain are connected across the inverter and the gate is connected to a control signal line 458. The EQ signal 458 actuates the pass gate transistor 482 and effectively shorts the first line 432 to the second line 434. Although this particular embodiment is fast, it also tends to have a relatively high power consumption.

Figure 5:
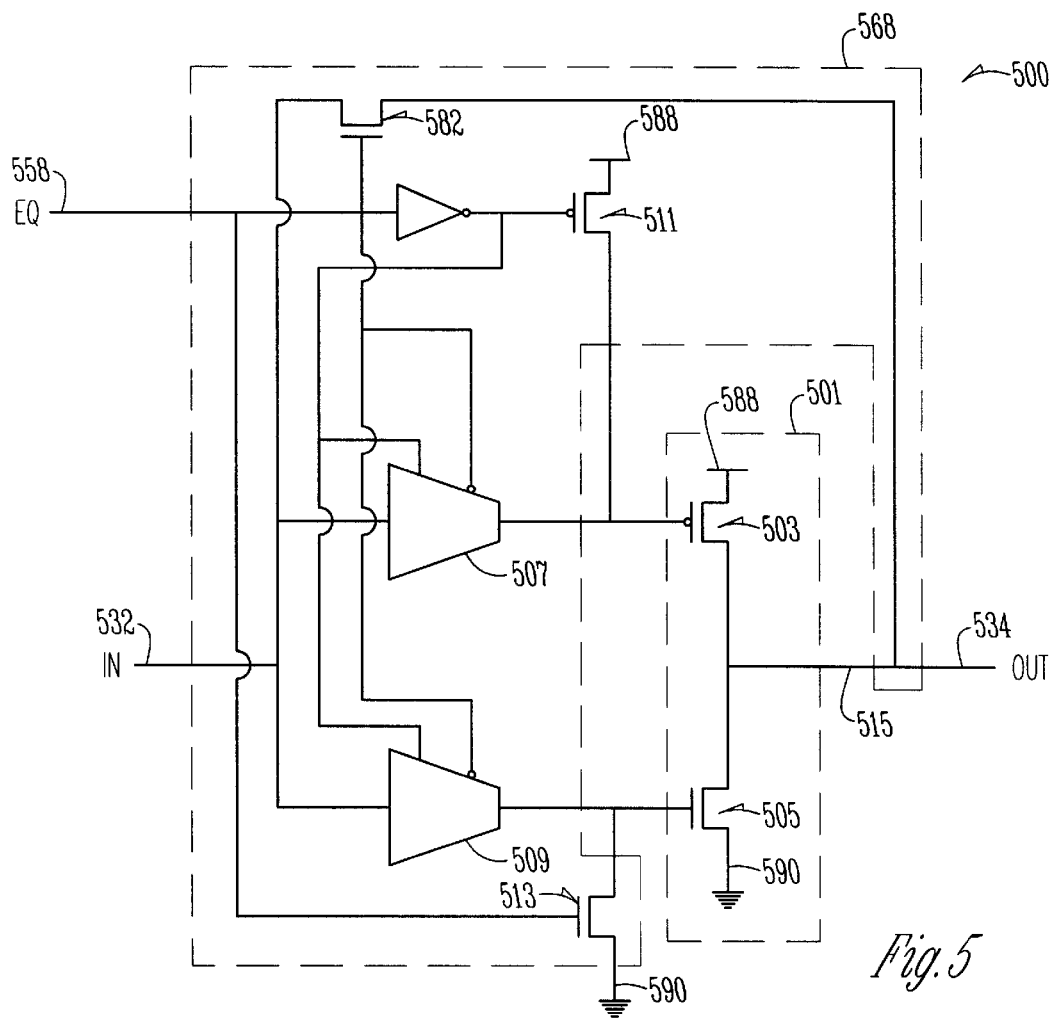
FIG. 5 illustrates another embodiment of the repeater.
Figure 11:
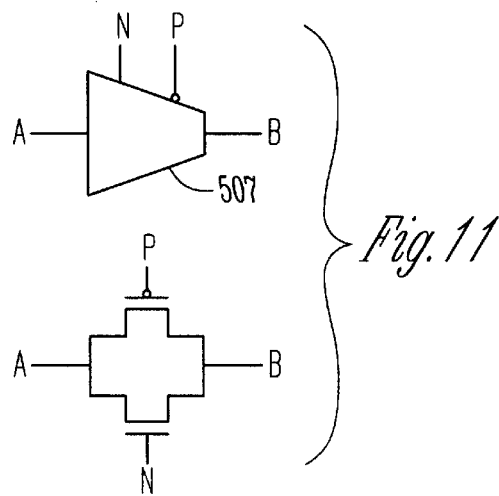
FIG. 11 illustrates a transmission gate.

FIG. 5 shows a repeater embodiment 500 wherein the inverting amplifier comprises a driving inverter 501 that includes a PMOS transistor 503 and an NMOS transistor 505 in a stacked configuration. The illustrated repeater embodiment 500 also includes at least one transmission gate 507 and 509 adapted for selectively passing an input signal to the inverting amplifier depending on the status of a control signal. The logic of a transmission gate is generally illustrated in FIG. 11. The transmission gate has an active-low P terminal and an active-high N terminal that correspond to the gates of a PMOS transistor and NMOS transistor respectively. Thus the transmission gate allows a signal to pass through without incurring a gate delay when the P terminal is low and the N terminal is high. The EQ signal 558 actuates the pass gate transistor 582 and effectively shorts the first line 532 to the second line 534.

In one embodiment as illustrated in FIG. 5, the equilibration circuit 568 includes a first transmission gate 507 and second transmission gate 509. Upon receiving a FIRE control signal 558, the first transmission gate 507 passes an input data signal to the PMOS transistor 503 and the second transmission gate 509 passes the input data signal to the NMOS transistor 505. However, upon receiving an EQ control signal 558, the input data signal will not be transmitted through the gates 507 and 509. Further, the input side of the gates 507 and 509 will function as a high-impedance open circuit that effectively isolates the first line 532 from the repeater amplifier 500. Additionally, one embodiment of the equilibration circuit 568 further includes a PMOS pull-up transistor 511 operably connected between a high power rail 588 and a gate of the PMOS driving transistor 503, and an NMOS pull-down transistor 513 operably connected between a low power rail 590 and a gate of the NMOS driving transistor 505. The EQ signal 558 actuates the pull-up transistor 588 to pull up the voltage at the gate of the PMOS driving transistor 505, and actuates the pull-down transistor 513 to pull down the voltage at the gate of the NMOS driving transistor 505. Thus, the EQ signal 558 turns off the driving transistors 503 and 505. When the driving transistors 503 and 505 are turned off, the output 515 of the inverting driver 501 provides a high impedance that effectively isolates the second line 534 from the repeater amplifier 500. Additionally, the pull-up and pull-down transistors 511 and 513 also conserve energy by effectively isolating the repeater 500 from the low and high power rails 588 and 590 so that the driving inverter 501 will not draw current during an inactive portion 114 of the cycle 110. This embodiment is desirable as it conserves energy, and only introduces one logic delay at the inverting driver 501.

Figure 6:
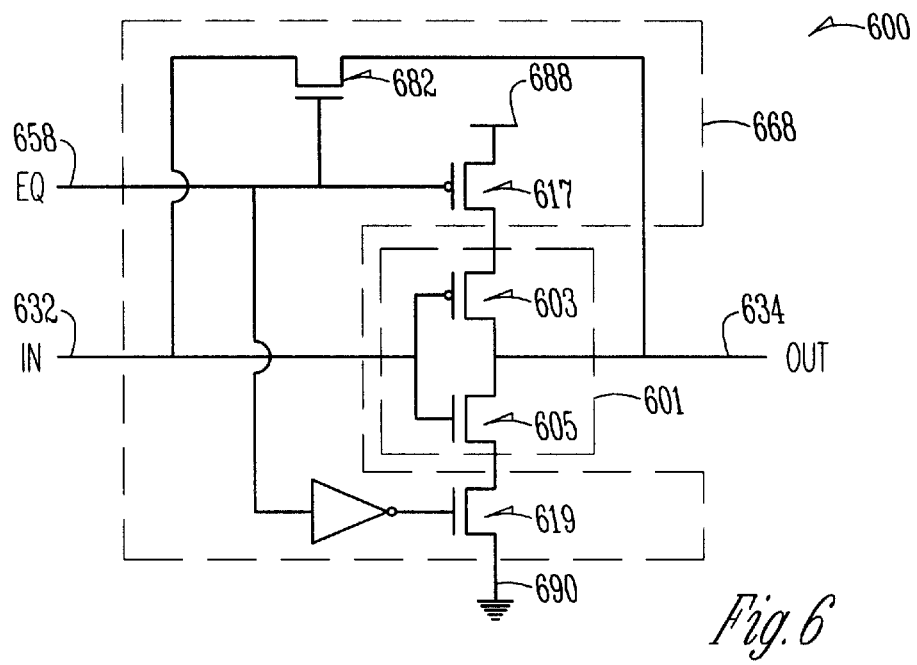
FIG. 6 illustrates another embodiment of the repeater.

FIG. 6 shows a repeater embodiment 600 wherein the inverting amplifier comprises a driving inverter 601 that includes a PMOS driving transistor 603 and an NMOS driving transistor 605 in a stacked configuration. In the illustrated embodiment, the equilibration circuit 668 includes a stacked power cutoff PMOS transistor 617, and a stacked power cutoff NMOS transistor 619. The stacked power cutoff PMOS transistor 617 is operably connected between the high power rail 688 and a drain of the PMOS driving transistor 603. The stacked power cutoff NMOS transistor 619 is operably connected between the low power rail 690 and a source of the NMOS driving transistor 605. The EQ control signal 658 is operably connected to gates on the stacked power cutoff transistors 617 and 619 to prevent current from flowing through the driving transistors 603 and 605. A disadvantage of this embodiment is that the stacked transistors 617 and 619 increase the resistance since the current must flow through two devices, i.e. through 617 and 603 or 605 and 619. This increased resistance is accommodated by incorporating larger transistors, and the larger transistors require more space and also slow the input down due to an increased capacitive load. The EQ signal 668 actuates the pass gate transistor 682 and effectively shorts the first line 632 to the second line 634.

Figure 7:
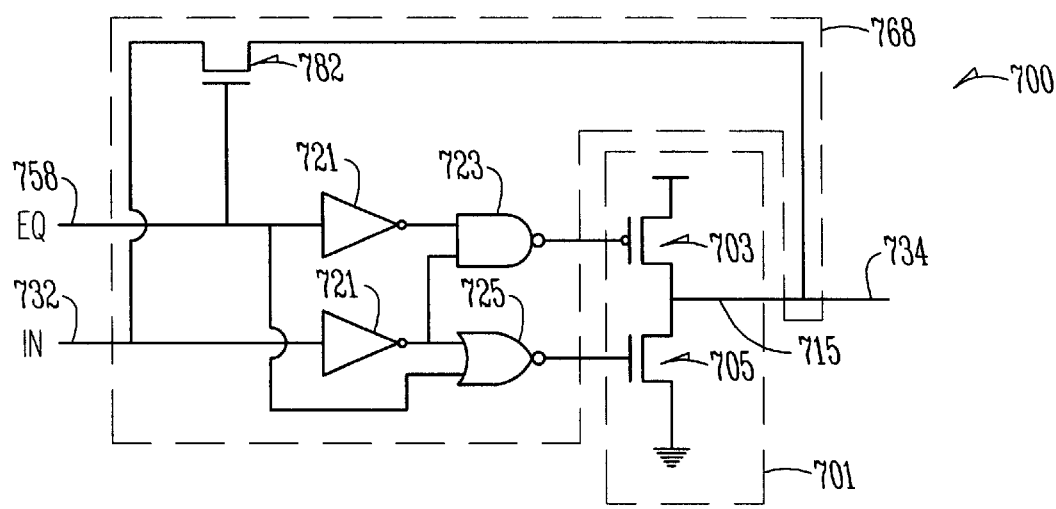
FIG. 7 illustrates another embodiment of the repeater.

FIG. 7 shows a repeater embodiment 700 wherein the inverting amplifier comprises a driving inverter 701 that includes a PMOS driving transistor 703 and an NMOS driving transistor 705 in a stacked configuration. In the illustrated embodiment, the equilibration circuit 768 includes logic circuitry, specifically invertors 721, a NAND 723 and a NOR 725 gate. The logic circuitry provides an output to the PMOS driving transistor 703, and another output to the NMOS driving transistor 705. The logic circuitry provides appropriate outputs such that a high EQ signal 758 will shut off the driving transistors and a low EQ signal will allow an inverted output signal be produced at the output 715. A disadvantage of this embodiment is that the logic gates require the input data signal to pass through three logic stages, as compared to the one stage of FIG. 5. The EQ signal 758 actuates the pass gate transistor 782 and effectively shorts the first line 732 to the second line 734.

Figure 8:
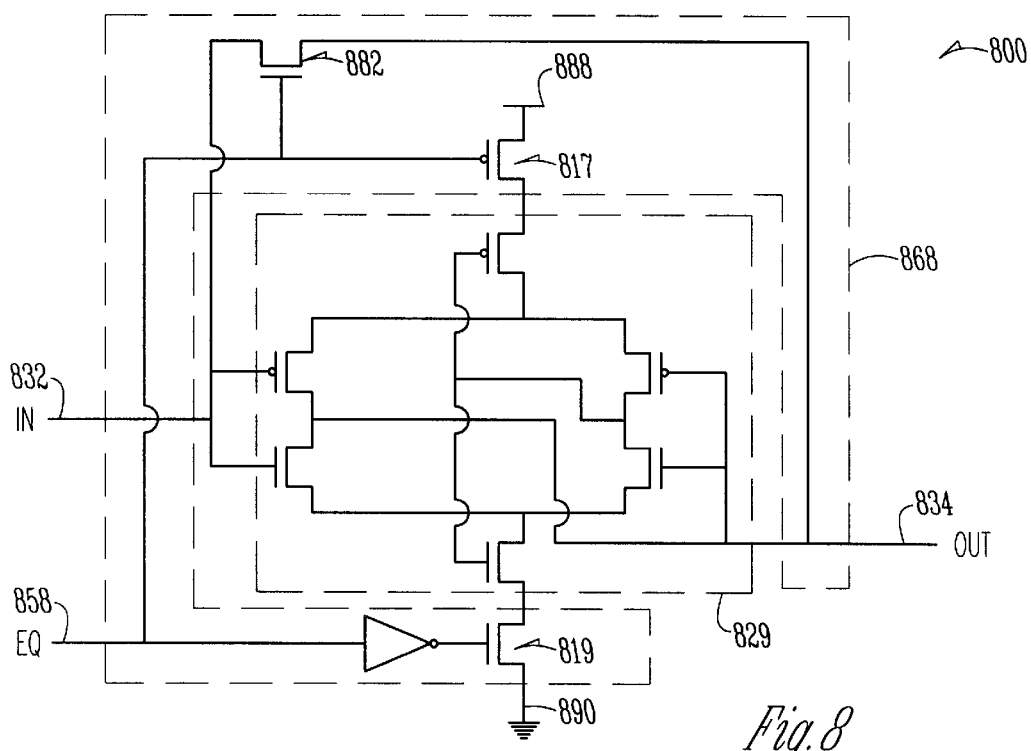
FIG. 8 illustrates another embodiment of the repeater.

FIG. 8 shows a repeater embodiment 800 wherein the inverting amplifier comprises a differential amplifier 829, and the equilibration circuit 868 includes a stacked power cutoff PMOS transistor 817, a stacked power cutoff NMOS transistor 819, and a pass gate transistor 882. The stacked power cutoff PMOS transistor 817 is operably connected between the high power rail 888 and the differential amplifier 829, and the stacked power cutoff NMOS transistor 819 is operably connected between the low power rail 890 and the differential amplifier 829. The pass gate transistor 882 shorts the isolated first line 832 to the isolated second line 834 during the inactive portion 114 of the cycle 110. The EQ control signal 858 is operably connected to gates of the power cutoff transistors 817 and 819 such that a high EQ control signal 858 will turn off the power cutoff transistors 817 and 819 and isolate the differential amplifier 829 from the power rails 888 and 890. Disadvantages of this embodiment also include the use of stacked transistors. The current must flow through three stacked transistors, which increases the effective resistance. The increased resistance is compensated by using larger transistors that take up more space and also can slow down the input due to an increased capacitive load. Additionally, this embodiment is relatively complicated. The EQ signal 868 actuates the pass gate transistor 882 and effectively shorts the first line 832 to the second line 834.

FIG. 9 shows a repeater embodiment 900 wherein the inverting amplifier comprises a flip-flop amplifier 931, and the equilibration circuit 968 includes a stacked power cutoff PMOS transistor 917, a stacked power cutoff NMOS transistor 919, and a pass gate transistor 982. The stacked power cutoff PMOS transistor 917 is operably connected between the high power rail 988 and the flip-flop amplifier 931, and the stacked power cutoff NMOS transistor 919 is operably connected between the low power rail 990 and the flip-flop amplifier 931. The pass gate transistor 982 shorts the isolated first line 932 to the isolated second line 934 during the inactive portion 114 of the cycle 110. The EQ control signal 958 is operably connected to gates of the power cutoff transistors 917 and 919 such that a high EQ control signal 958 will turn off the power cutoff transistors 917 and 919 and isolate the flip-flop amplifier 931 from the power rails 988 and 990. An advantage of this embodiment is that the flip-flop amplifier 931 will react when a small differential voltage is detected, which allows the flip-flop amplifier 931 to detect the start of a signal. Disadvantages of this embodiment include the incorporation of a stack of two transistors, which increases the resistance as described above. Additionally, proper timing is important to properly operate the flip-flop amplifier.

As the examples described above illustrate, the pass gate transistor provides means for providing substantially equal potentials of a value between potentials corresponding to the first logic value and the second logic value during an inactive portion of the cycle. Additionally, circuitry adapted to disable the driving transistors of the inverter amplifier provide means for isolating the amplifier from power rails during the inactive portion of the cycle. This disabling circuitry includes the pull-up and pull-down transistors of FIG. 5, the stacked power cutoff transistors of FIGS. 6, 8 and 9, and the NAND and NOR logic gates of FIG. 7.

FIG. 10 shows another aspect, specifically a memory device system 1000. The memory device 1000 generally comprises a memory address control 1002, a driver 1040, a receiver 1042, a memory array 1004, and a repeater 1010. The memory address control 1002 provides a data signal 1056 and provides a control signal 1058 that determines an active portion and an inactive portion of a cycle. The driver 1040 receives the data signal 1056 from the memory address control 1002 and drives the data signal onto a transmission line 1030 during the active portion. The driver is isolated from the transmission line during the inactive portion. In one embodiment as illustrated in FIG. 2, for example, the driver 1040 includes a driving inverter 244 and further includes logic circuitry that receives the control signal as an input. The control signal causes the logic circuitry to turn off the driving inverter, which in turn provides a floating or high-impedance output. The receiver 1042 receives the data signal from the transmission line during the active portion, is isolated from the transmission line during the inactive portion, and retains the data signal from a preceding active portion during an inactive portion. In one embodiment as illustrated in FIG. 2, the receiver 1042 includes a transmission gate 260 and a latch 262. An unactuated transmission gate 260 provides an open circuit which isolates the receiver from the transmission line.

The repeater 1010 generally includes an inverting amplifier and an equilibration circuit. The inverting amplifier has an input connected to a first line and an output connected to a second line. The amplifier receives the data signal at a first logic value and transmits the data signal at a second logic value during an active portion of a cycle. The equilibration circuit electrically isolates the first line and the second line and shorts the first line to the second line during an inactive portion of the cycle. Details of the repeater were described above, and as such will not be repeated here with respect to the memory device system.

One embodiment of the memory device 1000 provides that the repeater amplifier is placed such that the first line and the second line have substantially equal capacitance. Thus, upon completion of the active portion of the cycle, the first line has a first potential corresponding to a first logic value and the second line has a second potential corresponding to a second logic value. Upon completion of the inactive portion of the cycle, the first line and the second line have substantially equal potentials of a value between the first potential and the second potential.

One embodiment of the memory device 1000 provides that the equilibration circuit isolates the first line from the first circuit and the second line from the second circuit, and another embodiment provides that the equilibration circuit isolates the inverting amplifier from the first line, the second line, and from power rails during the inactive portion of the cycle.

A pulse generator 1064 receives the control signal and produces a pulse signal that latches the data signal in the receiver 1042 during the active portion of the cycle, such that the equilibration circuit is able to isolate the first line and the second line, and short the first line to the second line without adversely affecting the output signal to the memory array. The memory device 1000 according to the present subject matter may also be included in a system that also includes a processor 1006.

Figure 12:
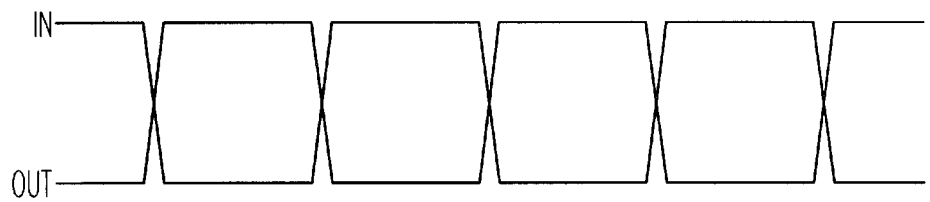
FIG. 12 illustrates a conventional full-logic transition wave form that switches between low and high logic potentials every cycle.
Figure 13:
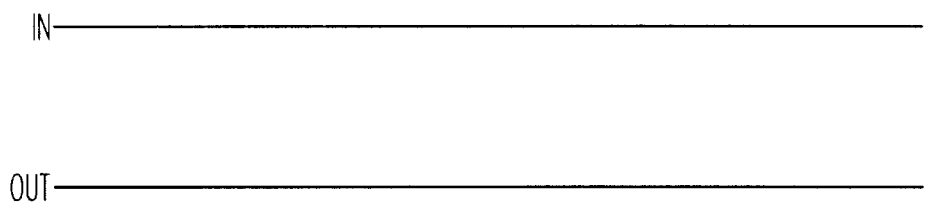
FIG. 13 illustrates a conventional full-logic transition wave form that never switches between low and high logic potentials.
Figure 14:
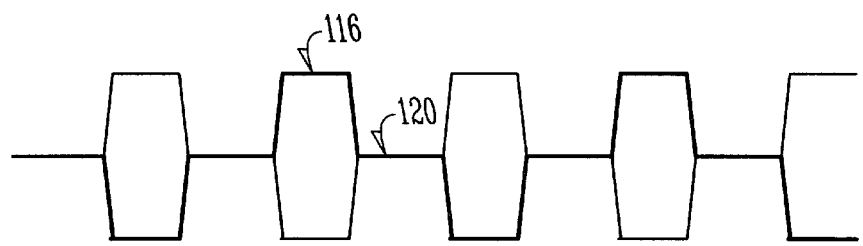
FIG. 14 illustrates a transition wave form that utilizes a starting potential and that switches between low and high logic potentials every cycle.
Figure 15:
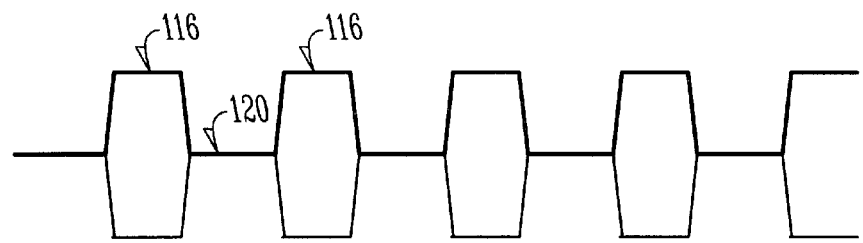
FIG. 15 illustrates a transition wave form that utilizes a starting potential and that never switches between low and high logic potentials.

The instantaneous power consumption savings is shown by comparing FIGS. 14 and 15 with FIGS. 12 and 13. FIG. 12 illustrates a conventional full-logic transition wave form that switches between low and high logic potentials every cycle; and FIG. 13 illustrates a conventional full-logic transition wave form that never switches between low and high logic potentials. FIG. 14 illustrates a transition wave form that utilizes a starting potential, which as described above is a potential between the high and low logic potentials at the beginning of an active portion of a cycle. This transition wave switches between low and high logic potentials every cycle. FIG. 15 illustrates a transition wave form that utilizes a starting potential and that never switches between low and high logic potentials. The bold lines represent half of the load of a long signal line connected to the input of an inverting amplifier, and the non-bold lines represent the other half of the load of the line connected to the output of the amplifier. Each half of the line has a capacitance of ½ C which will be proportional to the current by the equation: $I = C\, dv/dt$. Therefore, by counting charge cycles and magnitudes, the relative current can be determined.

FIG. 14 and FIG. 12 show an extreme condition where the line switches logic states every cycle, in which case the present subject matter, as illustrated in FIG. 14, consumes half of the current as that being consumed by the conventional full-logic transition waveforms, as illustrated in FIG. 12. FIG. 15 and FIG. 13 show an unrealistic condition where the signal never switches logic states, in which case the present subject matter, as illustrated in FIG. 15, would consume more current than the conventional full-logic transition waveform, as illustrated in FIG. 13. In the case where the signals on the line are essentially random, the overall power consumed by the repeater amplifier, as described herein, and the conventional inverter may average out over time to be close to each other. However, the worse case instantaneous power requirement for the repeater amplifier is reduced by the present subject matter.

The figures presented and described in detail above are similarly useful in describing the method aspects of the present subject matter. The method described below are nonexclusive as other methods may be understood from the specification and the figures described above.

One method for signaling over a transmission line generally comprises a first process that is performed during an active portion of a cycle and a second process that is performed during an inactive portion of the cycle. The first process includes receiving an input signal on a first line at a first logic potential, and transmitting an inverted output signal on a second line at a second logic potential. The second process includes isolating the first line from a first circuit and a repeater, isolating the second line from the second circuit and the repeater, and electrically shorting the first line to the second line to provide substantially equal potentials between the first potential and the second potential.

One embodiment also comprises providing a control signal that controls transitions between the active portion and the inactive portion of the cycle. Another embodiment provides that isolating the first line and the second line comprises isolating the first line from a first circuit and from a repeater, and isolating the second line from a second circuit and from the repeater. Isolating the first line and the second line further may comprise isolating an inverting amplifier that is positioned between the first line and the second line within the repeater from power rails. One embodiment of this method provides that electrically shorting the first line to the second line comprises providing a switch spanning across from the first line to the second line, and closing the switch during the inactive portion. Another embodiment of this method provides that electrically connecting the first line to the second line comprises providing a pass gate transistor whose gate is connected to a control signal, and actuating the pass gate transistor to electrically short the first line to the second line.

Another method decreases power drain in an integrated circuit transmission line. This method generally comprises providing a repeater; segmenting a transmission line into a first line and a second line with the repeater; providing an input signal to an input of the repeater; and in response to the input signal, producing an inverted output signal at an output of the repeater. The method further comprises, in response to a control signal, isolating the first line from a first circuit and from the repeater; isolating the second line from the second circuit, the repeater and power rails; and electrically shorting the first line to the second line to provide substantially equal starting potentials between the first logic potential and the second logic potential.

One embodiment of this method also includes electrically shorting the first line to the second line comprises providing a switch spanning across from the first line to the second line. In one embodiment, electrically shorting the first line to the second line comprises providing a pass gate transistor adapted for shorting the isolated first line to the isolated second line during the inactive portion of the cycle, and actuating the pass gate transistor to electrically short the first line to the second line.

CONCLUSION

The present subject matter improves signal propagation, and is particularly useful on integrated circuit transmission lines. An inverting amplifier is connected in line with the transmission line to form a first line on an input side of the inverting amplifier and a second line on the output side of the inverting amplifier. During an active portion of a signaling cycle, the first line is at a first logic potential and the second line is at an inverted second logic potential. During an inactive portion of a cycle, an equilibration circuit isolates the first line and the second line, and effectively shorts the isolated first line to the isolated second line. Upon completing the inactive portion, the lines have substantially equal voltage potential at a value between the high and low logic potentials; i.e. the line that has a higher voltage potential charge shares with the line that has a lower voltage potential and thus raises the voltage potential of that line. Therefore, the equilibration circuit provides a starting potential in between the high logic potential and the low logic potential in anticipation of the next active portion. The time required to make a transition from the starting potential to either a high or low logic potential is less than the time required to make a full logic potential transition between the first and second logic potentials. In one embodiment, the capacitance, and thus the ability to hold charge, of the first line is approximately equal to the capacitance of the second line in one embodiment such that the starting potential is approximately midway between the high and low logic potentials, allowing the repeater to respond equally fast to either low-logic potential transitions or high-logic potential transitions. One embodiment selectively isolates the amplifier from the power rails to reduce power drain.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A repeater, comprising:
    an inverting amplifier having an input connected to a first line and an output connected to a second line, wherein the amplifier receives an input signal at a first logic potential and transmits an output signal at a second logic potential during an active portion of a cycle; and
    an equilibration circuit adapted for electrically isolating the first line and the second line and shorting the first line to the second line during an inactive portion of the cycle.

2. The repeater of claim 1, wherein the first line and the second line have substantially equal capacitance.

3. The repeater of claim 1, wherein:
    upon completion of the active portion of the cycle, the first line has a first logic potential and the second line has a second logic potential; and
    upon completion of the inactive portion of the cycle, the first line and the second line have substantially equal starting potentials between the first logic potential and the second logic potential.

4. The repeater of claim 1, wherein a control signal is provided to control the active portion and the inactive portion of the cycle.

5. The repeater of claim 1, wherein the equilibration circuit isolates the first line and the second line.

6. The repeater of claim 1, wherein the equilibration circuit isolates the inverting amplifier from power rails during the inactive portion of the cycle.

7. An integrated circuit transmission line repeater, comprising:
    an inverting amplifier having an input connected to a first line and an output connected to a second line, wherein the amplifier receives an input signal at a first logic potential and transmits an output signal at a second logic potential during an active portion of a cycle, and wherein the first line and the second line have substantially equal capacitance;
    an equilibration circuit adapted for electrically isolating the first line and the second line and shorting the first line to the second line during an inactive portion of the cycle;
    wherein upon completion of the active portion of the cycle, the first line has a first logic potential and the second line has a second logic potential; and
    wherein upon completion of the inactive portion of the cycle, the first line and the second line have substantially equal starting potentials between the first logic potential and the second logic potential.

8. The integrated circuit transmission line repeater of claim 7, wherein the inverting amplifier includes a buffer inverter, and wherein the equilibration circuit includes a pass gate transistor adapted for shorting the isolated first line to the isolated second line during the inactive portion of the cycle.

9. The integrated circuit transmission line repeater of claim 7, wherein the inverting amplifier comprises a driving inverter that includes a PMOS transistor and an NMOS transistor in a stacked configuration.

10. The integrated circuit transmission line repeater of claim 7, wherein the equilibration circuit includes at least one transmission gate adapted for selectively passing an input signal to the inverting amplifier depending on the status of a control signal.

11. The integrated circuit transmission line repeater of claim 7, wherein:
    the inverting amplifier comprises a driving inverter that includes a PMOS driving transistor and an NMOS driving transistor in a stacked configuration; and
    the equilibration circuit comprises:
        a first transmission gate adapted for passing an input signal to the PMOS transistor when a control signal is received;

a second transmission gate adapted for passing the input signal to the NMOS transistor when the control signal is received; and a pass gate transistor adapted for shorting the isolated first line to the isolated second line during the inactive portion of the cycle.

12. The integrated circuit transmission line repeater of claim 11, wherein the equilibration circuit further includes a PMOS pull-up transistor operably connected between a high power rail and a gate of the PMOS driving transistor, and an NMOS pull-down transistor operably connected between a low power rail and a gate of the NMOS driving transistor.

13. The integrated circuit transmission line repeater of claim 7, wherein:

the inverting amplifier comprises a driving inverter that includes a PMOS driving transistor and an NMOS driving transistor in a stacked configuration;

the equilibration circuit includes:
  a stacked power cutoff PMOS transistor operably connected between a high power rail and a drain of the PMOS driving transistor; and
  a stacked power cutoff NMOS transistor operably connected between a low power rail and a source of the NMOS driving transistor; and
  a control signal is operably connected to gates on the stacked power cutoff transistors to prevent current from flowing through the driving transistors during the inactive portion of the cycle.

14. The integrated circuit transmission line repeater of claim 7, wherein:

the inverting amplifier comprises a driving inverter that includes a PMOS driving transistor and an NMOS driving transistor in a stacked configuration; and the equilibration circuit comprises:
  logic circuitry adapted for controlling the driving inverter by providing control signals to the PMOS and NMOS driving transistors such that the driving inverter transmits the output signal during the active portion of the cycle and isolates the first and second lines during the inactive portion of the cycle; and
  a pass gate transistor adapted for shorting the isolated first line to the isolated second line during an inactive portion of the cycle.

15. The integrated circuit transmission line repeater of claim 7, wherein:

the inverting amplifier includes a differential amplifier;

the equilibration circuit includes:
  a stacked power cutoff PMOS transistor operably connected between a high power rail and the differential amplifier;
  a stacked power cutoff NMOS transistor operably connected between a low power rail and the differential amplifier; and
  a pass gate transistor adapted for shorting the isolated first line to the isolated second line during an inactive portion of the cycle; and a control signal is operably connected to gates on the power cutoff transistors to prevent current from flowing during the inactive portion of the cycle.

16. The integrated circuit transmission line repeater of claim 7, wherein:

the inverting amplifier includes a flip-flop amplifier;

the equilibration circuit includes:
  a power cutoff PMOS transistor operably connected between a high power rail and the flip-flop amplifier,
  a stacked power cutoff NMOS transistor operably connected between a low power rail and the flip-flop amplifier; and a pass gate transistor adapted for shorting the isolated first line to the isolated second line during the inactive portion of the cycle; and a control signal is operably connected to gates on the power cutoff transistors to prevent current from flowing during the inactive portion of the gate.

17. A repeater, comprising:

an inverting amplifier having an input connected to a first line and an output connected to a second line, wherein the amplifier receives an input signal at a first logic potential and transmits an output signal at a second logic potential during an active portion of a cycle;

an isolation circuit adapted for isolating the first line and the second line during an inactive portion of the cycle; and a pass gate transistor adapted for shorting the first line to the second line during the inactive portion of the cycle.

18. A transmission line system, comprising:

a first circuit, a second circuit, and a transmission line extending between the first circuit and the second circuit; and a repeater, including:
  an inverting amplifier segmenting the transmission line into a first line and a second line, wherein the first circuit sends an input signal to the inverting amplifier and the amplifier sends an inverted output signal to the second circuit during an active portion of a cycle; and
  an equilibration circuit, wherein the equilibration circuit electrically isolates both the first line and the second line, and shorts the first line to the second line during an inactive portion of the cycle.

19. The transmission line system of claim 18, wherein the inverting amplifier is positioned substantially near a transmission line midpoint between the first circuit and the second circuit.

20. The transmission line system of claim 18, wherein the isolated first line and the isolated second line have substantially equal capacitance.

21. The transmission line system of claim 18, wherein:

upon completion of the active portion of the cycle, the first line has a first logic potential and the second line has an inverted second logic potential; and upon completion of the inactive portion of the cycle, the first line and the second line have substantially equal starting potentials between the first logic potential and the second logic potential.

22. The transmission line system of claim 18, wherein a control signal is provided to control the active portion and the inactive portion of the cycle.

23. The transmission line system of claim 18, wherein the equilibration circuit isolates the first line from the first circuit and the second line from the second circuit.

24. The transmission line system of claim 18, wherein the equilibration circuit isolates the first line from the first circuit, the second line from the second circuit, and the inverting amplifier from power rails during the inactive portion of the cycle.

25. A transmission line system, comprising:

a first circuit, a second circuit, and a transmission line extending between the first circuit and the second circuit; and a repeater, including:
  an inverting amplifier positioned substantially near a transmission line midpoint between the first circuit and the second circuit to segment the transmission line into a first line and a second line that have substantially equal capacitance, wherein the first circuit sends an input signal to the inverting amplifier and the amplifier sends an inverted output signal to the second circuit during an active portion of the cycle; and an equilibration circuit, wherein the equilibration circuit electrically isolates both the first line and the second line, and shorts the first line to the second line during an inactive portion of the cycle.

26. The transmission line system of claim 25, wherein:

upon completion of the active portion of the cycle, the first line has a first logic potential and the second line has a second logic potential; and upon completion of the inactive portion of the cycle, the first line and the second line have substantially equal starting potentials between the first logic potential and the second logic potential.

27. The transmission line system of claim 25, wherein a control signal is provided to control the active portion and inactive portion of the cycle.

28. A transmission line system, comprising:

a transmission line extending between a first circuit and a second circuit; and a repeater, including:

an inverting amplifier segmenting the transmission line into a first line and a second line that have substantially equal capacitance; and an equilibration circuit;

wherein the first circuit sends an input signal to the inverting amplifier and the amplifier sends an inverted output signal to the second circuit during an active portion of the cycle;

wherein upon completion of the active portion of the cycle, the first line has a first logic potential and the second line has a second logic potential;

wherein the equilibration circuit electrically isolates the first line and the second line, and shorts the first line to the second line during an inactive portion of the cycle; and wherein upon completion of the inactive portion of the cycle, the first line and the second line have substantially equal starting potentials between the first logic potential and the second logic potential.

29. The transmission line system of claim 28, wherein the inverting amplifier is positioned substantially near a transmission line midpoint between the first circuit and the second circuit.

30. The transmission line system of claim 28, wherein a control signal is provided to control the active portion and the inactive portion of the cycle.

31. The transmission line system of claim 28, wherein the equilibration circuit isolates the first line from the first circuit and the second line from the second circuit.

32. The transmission line system of claim 28, wherein the equilibration circuit isolates the first line from the first circuit, the second line from the second circuit, and the inverting amplifier from power rails during the inactive portion of the cycle.

33. A transmission line system, comprising:

a transmission line extending between a first circuit and a second circuit;

an inverting amplifier segmenting the transmission line into a first line and a second line, wherein the first circuit sends an input signal to the inverting amplifier and the amplifier sends an inverted output signal to the second circuit during an active portion of the cycle; and an equilibration circuit, wherein the equilibration circuit isolates the first line from the first circuit, isolates the second line from the second circuit, isolates the inverting amplifier from power rails during an inactive portion of the cycle, and shorts the first line to the second line.

34. The transmission line system of claim 33, wherein the inverting amplifier is positioned substantially near a transmission line midpoint between the first circuit and the second circuit.

35. The transmission line system of claim 33, wherein the isolated first line and the isolated second line have substantially equal capacitance.

36. The transmission line system of claim 33, wherein:

upon completion of the active portion of the cycle, the first line has a first logic potential and the second line has a second logic potential; and upon completion of the inactive portion of the cycle, the first line and the second line have substantially equal potentials between the first logic potential and the second logic potential.

37. The transmission line system of claim 33, wherein a control signal is provided to control the active portion and the inactive portion of the cycle.

38. A transmission line system, comprising:

a transmission line; and a repeater segmenting the transmission line into a first line and a second line, wherein the repeater is adapted for:

receiving an input signal at a first logic potential and transmitting an output signal at a second logic potential during an active portion of the cycle; and electrically isolating the first line and the second line and shorting the first line to the second line during an inactive portion of the cycle.

39. The transmission line system of claim 38, wherein the repeater comprises:

an inverting amplifier having an input connected to the first line and output connected to the second line; and an equilibration circuit adapted for electrically isolating the first line and the second line and shorting the first line to the second line.

40. The transmission line system of claim 38, wherein the repeater is positioned substantially near a transmission line midpoint between the first circuit and the second circuit.

41. The transmission line system of claim 38, wherein the isolated first line and the isolated second line have substantially equal capacitance.

42. The transmission line system of claim 38, wherein:

upon completion of the active portion of the cycle, the first line has the first logic potential and the second line has the second logic potential; and upon completion of the inactive portion of the cycle, the first line and the second line have substantially equal starting potentials between the first logic potential and the second logic potential.

43. The transmission line system of claim 38, wherein a control signal is provided to control the active portion and the inactive portion of the cycle.

44. An integrated circuit transmission line system, comprising:

a transmission line; and a repeater segmenting the transmission line into a first line and a second line, the repeater including:

an inverting amplifier having an input connected to the first line and an output connected to the second line, wherein the amplifier receives an input signal at a first logic potential and transmits an output signal at a second logic potential during an active portion of a cycle; and an equilibration circuit adapted for electrically isolating the first line and the second line and shorting the first line to the second line during an inactive portion of the cycle.

45. The integrated circuit transmission line system of claim 44, wherein the inverting amplifier includes a buffer inverter, and wherein the equilibration circuit includes a pass gate transistor adapted for shorting the isolated first line to the isolated second line during the inactive portion of the cycle.

46. The integrated circuit transmission line system of claim 44, wherein the inverting amplifier comprises a driving inverter that includes a PMOS transistor and an NMOS transistor in a stacked configuration.

47. The integrated circuit transmission line system of claim 44, wherein the equilibration circuit includes at least one transmission gate adapted for selectively passing an input signal to the inverting amplifier depending on the status of a control signal.

48. The integrated circuit transmission line system of claim 44, wherein:

the inverting amplifier comprises a driving inverter that includes a PMOS driving transistor and an NMOS driving transistor in a stacked configuration; and the equilibration circuit comprises:
a first transmission gate adapted for passing an input signal to the PMOS transistor when a control signal is received;
a second transmission gate adapted for passing the input signal to the NMOS transistor when the control signal is received; and
a pass gate transistor adapted for shorting the isolated first line to the isolated second line during the inactive portion of the cycle.

49. The integrated circuit transmission line system of claim 48, wherein the equilibration circuit further includes a PMOS pull-up transistor operably connected between a high power rail and a gate of the PMOS driving transistor, and an NMOS pull-down transistor operably connected between a low power rail and a gate of the NMOS driving transistor.

50. The integrated circuit transmission line system of claim 44, wherein:

the inverting amplifier comprises a driving inverter that includes a PMOS driving transistor and an NMOS driving transistor in a stacked configuration;

the equilibration circuit includes:
a stacked power cutoff PMOS transistor operably connected between a high power rail and a drain of the PMOS driving transistor;
a stacked power cutoff NMOS transistor operably connected between a low power rail and a source of the NMOS driving transistor; and
a pass gate transistor adapted for shorting the isolated first line to the isolated second line during the inactive portion of the cycle; and a control signal is operably connected to gates on the stacked power cutoff transistors to prevent current from flowing through the driving transistors during the inactive portion of the cycle.

51. The integrated circuit transmission line of claim 44, wherein:

the inverting amplifier comprises a driving inverter that includes a PMOS driving transistor and an NMOS driving transistor in a stacked configuration; and the equilibration circuit comprises:
logic circuitry adapted for controlling the driving inverter by providing control signals to the PMOS and NMOS driving transistors such that the driving inverter transmits the output signal during the active portion of the cycle and isolates the first and second lines during the inactive portion of the cycle; and
a pass gate transistor adapted for shorting the isolated first line to the isolated second line during an inactive portion of the cycle.

52. The integrated circuit transmission line system of claim 44, wherein:

the inverting amplifier includes a differential amplifier;

the equilibration circuit includes:
a stacked power cutoff PMOS transistor operably connected between a high power rail and the differential amplifier;
a stacked power cutoff NMOS transistor operably connected between a low power rail and the differential amplifier; and
a pass gate transistor adapted for shorting the isolated first line to the isolated second line during the inactive portion of the cycle; and a control signal is operably connected to gates on the power cutoff transistors to prevent current from flowing during the inactive portion of the cycle.

53. The transmission line system of claim 44, wherein:

the inverting amplifier includes a flip-flop amplifier;

the equilibration circuit includes:
a power cutoff PMOS transistor operably connected between a high power rail and the flip-flop amplifier;
a stacked power cutoff NMOS transistor operably connected between a low power rail and the flip-flop amplifier; and
a pass gate transistor adapted for shorting the isolated first line to the isolated second line during an inactive portion of the cycle; and a control signal is operably connected to gates on the power cutoff transistors to prevent current from flowing during the inactive portion of the cycle.

54. An integrated circuit transmission line system, comprising:

a transmission line; and a repeater segmenting the transmission line into a first line and a second line, the repeater including:
an inverting amplifier having an input connected to the first line and an output connected to the second line, wherein the amplifier receives an input signal at a first logic potential and transmits an output signal at a second logic potential during an active portion of a cycle, wherein the inverting amplifier comprises a driving inverter that includes a PMOS driving transistor and an NMOS driving transistor in a stacked configuration; and a equilibration circuit adapted for electrically isolating the first line and the second line and shorting the first line to the second line during an inactive portion of the cycle, wherein the equilibration circuit includes:
a first transmission gate adapted for passing an input signal to the PMOS transistor when a control signal is received;
a second transmission gate adapted for passing the input signal to the NMOS transistor when the control signal is received;

a PMOS pull-up transistor operably connected between a high power rail and a gate of the PMOS driving transistor; and an NMOS pull-down transistor operably connected between a low power rail and a gate of the NMOS driving transistor.

55. A memory device, comprising:

a memory address control adapted for providing a data signal and a control signal that determines an active portion and an inactive portion of a cycle;

a driver adapted for:

receiving the data signal from the memory address control and for driving the data signal onto a transmission line during the active portion; and isolating from the transmission line during the inactive portion; a receiver adapted for:

receiving the data signal from the transmission line during the active portion;

becoming isolated from the transmission line during the inactive portion; and retaining the data signal from a preceding active portion during an inactive portion;

a memory array adapted for receiving the data signal from the receiver; and a repeater, including:

an inverting amplifier having an input connected to a first portion of the transmission line and an output connected to a second portion of the transmission line, wherein the amplifier receives the data signal at a first logic potential and transmits the data signal at a second logic potential during an active portion of a cycle; and an equilibration circuit adapted for electrically isolating the first line and the second line and shorting the first line to the second line during an inactive portion of the cycle.

56. The memory device of claim 55, wherein the first line and the second line have substantially equal capacitance.

57. The memory device of claim 55, wherein:

upon completion of the active portion of the cycle, the first line has the first logic potential and the second line has the second logic potential; and upon completion of the inactive portion of the cycle, the first line and the second line have substantially equal starting potentials between the first logic potential and the second logic potential.

58. The memory device of claim 55, wherein the equilibration circuit isolates the first line from the first circuit and the second line from the second circuit.

59. The memory device of claim 55, wherein the equilibration circuit isolates the inverting amplifier from the first line, the second line, and power rails during the inactive portion of the cycle.

60. The memory device of claim 55, further comprising a pulse generator adapted for receiving the control signal and producing a pulse signal that latches the data signal in the receiver during the active portion of the cycle.

61. A system, comprising:

a processor; and a memory device in electrical communication with the processor, wherein the memory device includes:

a memory address control adapted for providing a data signal and a control signal that determines an active portion and an inactive portion of a cycle;

a driver adapted for:

receiving the data signal from the memory address control and for driving the data signal onto a transmission line during the active portion; and isolating from the transmission line during the inactive portion;

a receiver adapted for:

receiving the data signal from the transmission line during the active portion;

becoming isolated from the transmission line during the inactive portion; and retaining the data signal from a preceding active portion during an inactive portion;

a memory array adapted for receiving the data signal from the receiver; and a repeater, including:

an inverting amplifier placed on the transmission line and dividing the line into a first line and a second line, wherein the inverting amplifier has an input connected to the first line and an output connected to the second line, wherein the amplifier receives the data signal at a first logic potential and transmits the data signal at a second logic potential during an active portion of a cycle; and an equilibration circuit adapted for electrically isolating the first line and the second line and shorting the first line to the second line during an inactive portion of the cycle.

62. A method for signaling over a transmission line, comprising:

during an active portion of a cycle, receiving an input signal on a first line at a first logic potential; and transmitting an inverted output signal on a second line at a second logic potential; and during an inactive portion of the cycle, isolating both the first line and the second line, and electrically shorting the first line to the second line.

63. The method of claim 62, further comprising providing a control signal that controls transitions between the active portion and the inactive portion of the cycle.

64. The method of claim 62, wherein isolating the first line and the second line comprises:

isolating the first line from a first circuit and from a repeater; and isolating the second line from a second circuit and from the repeater.

65. The method of claim 64, wherein isolating the first line and the second line further comprises isolating an inverting amplifier within the repeater from power rails, wherein the inverting amplifier is positioned between the first line and the second line.

66. The method of claim 62, wherein electrically shorting the first line to the second line comprises providing a switch spanning across from the first line to the second line, and closing the switch during the inactive portion.

67. The method of claim 62, wherein electrically connecting the first line to the second line comprises:

providing a pass gate transistor adapted for shorting the isolated first line to the isolated second line during the inactive portion of the cycle; and actuating the pass gate transistor to electrically short the first line to the second line.

68. A method for signaling over a transmission line, comprising:

during an active portion of a cycle, receiving an input signal on a first line at a first logic potential; and transmitting an inverted output signal on a second line at a second logic potential; and during an inactive portion of the cycle, isolating the first line from a first circuit and from a repeater, isolating the second line from the second circuit and the repeater, and electrically shorting the first line to the second line to provide substantially equal starting potentials between the first logic potential and the second logic potential.

69. The method of claim 68, further comprising providing a control signal that controls transitions between the active portion and the inactive portion of the cycle.

70. The method of claim 68, wherein isolating the first line and the second line further comprises isolating an inverting amplifier within the repeater from power rails, wherein the inverting amplifier is positioned between the first line and the second line.

71. The method of claim 68, wherein electrically shorting the first line to the second line comprises providing a switch spanning across from the first line to the second line, and closing the switch during the inactive portion.

72. The method of claim 68, wherein electrically shorting the first line to the second line comprises:

providing a pass gate transistor adapted for shorting the isolated first line to the isolated second line during the inactive portion of the cycle; and actuating the pass gate transistor to electrically short the first line to the second line.

73. A method for decreasing power drain in a transmission line, comprising:

providing a repeater;

segmenting a transmission line into a first line and a second line with the repeater;

providing an input signal to an input of the repeater;

in response to the input signal, producing an inverted output signal at an output of the repeater;

in response to a control signal, isolating the first line from a first circuit and from the repeater;

isolating the second line from the second circuit, the repeater and power rails; and electrically shorting the first line to the second line to provide substantially equal starting potentials between the first logic potential and the second logic potential.

74. The method of claim 73, wherein electrically shorting the first line to the second line comprises providing a switch spanning across from the first line to the second line.

75. The method of claim 73, wherein electrically shorting the first line to the second line comprises:

providing a pass gate transistor adapted for shorting the isolated first line to the isolated second line during the inactive portion of the cycle; and actuating the pass gate transistor to electrically short the first line to the second line.

* * * * *

UNITED STATES PATENT AND TRADEMARK OFFICE
CERTIFICATE OF CORRECTION

PATENT NO.     : 6,515,516 B2  
DATED          : February 4, 2003  
INVENTOR(S)    : Donald M. Morgan It is certified that error appears in the above-identified patent and that said Letters Patent is hereby corrected as shown below:

<u>Title page,</u>
Item [57], ABSTRACT,
Line 6, delete "and" after "receives".
Line 8, delete "and" after "during".
Line 11, delete "and" after "during".

<u>Column 1,</u>
Line 33, delete "on" and insert -- an --, therefor.
Line 42, delete "high-to low" and insert -- high-to-low --, therefor.

<u>Column 20,</u>
Line 58, delete "a" and insert -- an --, therefor.

Signed and Sealed this

Twenty-ninth Day of July, 2003

JAMES E. ROGAN
*Director of the United States Patent and Trademark Office*